United States Patent [19]
Litman et al.

[11] Patent Number: 6,120,883
[45] Date of Patent: Sep. 19, 2000

[54] COMPUTER PRINTABLE TOP COATING

[75] Inventors: Gary Jay Litman, Framingham; Nancy Orlando, North Andover, both of Mass.

[73] Assignee: Furon Company, Aurora, Ohio

[21] Appl. No.: 08/914,826

[22] Filed: Aug. 19, 1997

(Under 37 CFR 1.47)

Related U.S. Application Data

[60] Provisional application No. 60/024,135, Aug. 19, 1996, abandoned.

[51] Int. Cl.$^7$ ...................................................... B32B 3/00
[52] U.S. Cl. .................... 428/206; 428/207; 428/213; 428/215; 428/336; 428/689; 428/195
[58] Field of Search ..................................... 428/212, 214, 428/404, 407, 689, 701, 702, 213, 141, 215, 216, 336, 198, 206, 207, 195; 528/125; 427/515; 522/81

[56] References Cited

U.S. PATENT DOCUMENTS

| | | | |
|---|---|---|---|
| 5,196,228 | 3/1993 | Kirby et al. | 427/515 |
| 5,514,729 | 5/1996 | Diamant et al. | 522/81 |
| 5,633,086 | 5/1997 | Hsu | 428/404 |
| 5,837,352 | 11/1998 | English et al. | 428/198 |

*Primary Examiner*—William Krynski
*Assistant Examiner*—Hong J. Xu
*Attorney, Agent, or Firm*—Fay, Sharpe, Fagan, Minnich & McKee, LLP

[57] ABSTRACT

A printable coating is disclosed, which is opaque as well as mar and scratch resistant. The coating contains a resin as a binder and, as a filler, titanium dioxide and boron nitride. The resultant coated film product can be used in various chemically and thermally demanding applications such as printed circuit board bar-code labels, wave solder masking tapes, automotive labels, and electrical insulation.

11 Claims, 1 Drawing Sheet

COMPUTER PRINTABLE TOP COATING

This application bases its priority on provisional application Ser. No. 60/024,135 filed on Aug. 19, 1996, abandoned.

FIELD OF THE INVENTION

The present invention pertains to an improved printable coating, which can be applied to a film. More particularly, the coating is opaque as well as scratch and mar resistant due to the unique formulation of a resin system and a filler containing both boron nitride and titanium dioxide.

BACKGROUND OF THE INVENTION

Continuing effort has been directed toward the development of coatings suitable for use in applications such as printed circuit board bar-code labels, wave solder masking tapes, automotive labels and electrical insulation. Historically, bar-code label construction applications have been particularly troublesome from two standpoints: (1) a harsh manufacturing environment; and (2) a harsh handling environment—both necessitating a scratch and mar resistant top surface. Since the bar-code label is attached early in the manufacturing process, such environments include temperatures up to 300° C.; UV exposure; solvent wash and vapor degrease using MEK, toluene, trichloroethylene, water, et cetera; acid etching with sulfuric acid, nitric acid, chromic acid, et cetera; wave solder and solder reflow; and vapor phase curing of surface mounted component adhesives.

Further, as to the handling environment, the bar-code label construction must be opaque to prohibit markings below the label from showing through and interfering with bar-code scanning. The top surface of the bar-code label must preferably be white to maximize contrast to the black bar-code ink. The top surface of the bar-code label must also be scratch and mar resistant to prevent markings from bar-code scanners and other handling hazards. These markings can interfere with the reading of the codes.

Bar-code label constructions presently available are problematic in that the top surface coatings are not entirely scratch and mar resistant to prevent markings caused as a result of the handling of the bar-code labels, particularly the use of the labels in combination with a bar code scanner. Thus, it is apparent that a need exists in the industry for a bar code label construction capable of withstanding the harsh environments associated with the manufacturing and the resultant handling of a bar code label construction.

BRIEF SUMMARY OF THE INVENTION

The present invention provides an improved printable coating, which can be applied to various films. The coating is scratch and mar resistant as well as opaque making it suitable for use in various applications, including bar-code label constructions.

According to a first aspect of the invention, a printable coating for use in chemically and thermally demanding applications is disclosed. The coating comprises a resin and a filler. The filler includes titanium oxide and boron nitride in a ratio of about 90 parts by weight boron nitride to about 10 parts by weight titanium dioxide.

According to a second aspect of the invention, a film for use in thermally and chemically demanding applications is disclosed. The film comprises a first coating applied on one surface of the film and a second coating applied as an interlayer between the first coating and the film. The first coating contains titanium dioxide and boron nitride.

According to a third aspect of the invention, a label readable by a bar-code scanner is disclosed. The label comprises a substrate having on at least one surface thereof a first coating containing a resin and a filler, the filler including boron nitride.

One advantage of the present invention is that a printable coating can be produced, which can withstand harsh thermal environments, e.g., temperatures up to 300° C.

Another advantage of the present invention is that a printable coating can be produced which can withstand harsh chemical environments, e.g., solvent wash, vapor degreasing, wave solder and acid etching.

Still another advantage of the present invention is that a printable coating is disclosed which is mar and scratch resistant as well as opaque.

Still another advantage of the present invention is that a scratch resistant bar-code label is disclosed.

Still another advantage of the present invention is that a wide array of products can be simply and economically manufactured using the coating disclosed herein. Such products include, among other things, printed circuit bar-code labels, wave solder masking tapes, automotive labels and electrical insulation.

Still other benefits and advantages of the invention will become apparent to those skilled in the art upon a reading and understanding of the following detailed specification.

BRIEF DESCRIPTION OF THE DRAWINGS

The invention may take physical form in certain parts and arrangement of parts, preferred and alternate embodiments of which will be described in detail in this specification and illustrated in the accompanying drawings which form a part hereof, and wherein.

DETAILED DESCRIPTION OF THE PREFERRED AND ALTERNATE EMBODIMENTS

Figure 1:
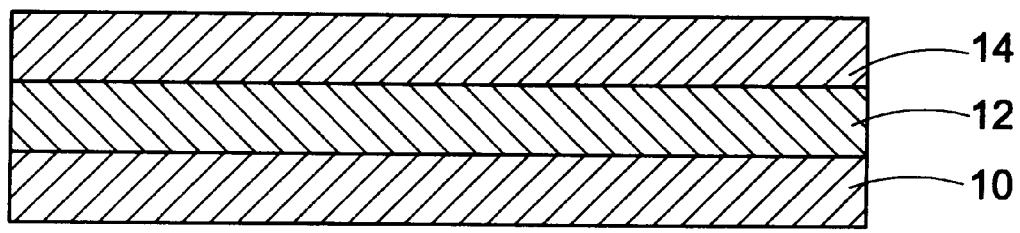
FIG. 1 is a cross-sectional view of the bar code label construction in accordance with the present invention.

Referring now to the drawings, wherein the showings are for purposes of illustrating the preferred and alternate embodiments of the invention only and not for purposes of limiting the same, FIG. 1 shows the printable coated film product of the present invention. Substrate 10 is a 2.0 mil film layer. Substrate 10 is coated on one side with both an opacifying coating 12 and a print receptive coating 14. Each of these coatings is a high modulus thermoset structural coating with good chemical and thermal resistance. Each, then, is particularly useful for thermally and chemically demanding applications.

A "thermally demanding" application is defined as one wherein temperatures may run as high as 300° C. By a "chemically demanding" application it is meant that the structure is subject to applications such as wave solder, solder reflow, or vapor phase deposition are used or wherein etching acids such as sulfuric, chromic, or nitric acid or organic solvents such as toluene, MEK, and 1,1,1 trichloroethylene are used. By the term "printable" it is meant that a thermal transfer ribbon dot matrix or laser printer, to name a few types of printers, will accept the image—that is, the image cannot be removed with tape.

The print receptive coating 14 is receptive to ribbon and thermal transfer inks as well as laser copiers. The print receptive coating 14 is white for maximum contrast to black inks. It is also non-abrasive and anti-marking and is preferably applied at a thickness of 0.6 mil (dried).

The print receptive coating 14 includes resin used as a binder. The resin is preferably an epoxy resin. By epoxy resin it is meant a reaction product of Bisphenol and Epichlorohydrin. The epoxy resin is filled with boron nitride (BN) and titanium dioxide ($TiO_2$). Alternative suitable resins of the present invention, which are not epoxy resins, include a polyurethane resin, an alkyd amine resin, a phenolic resin, a polyethersulfone resin, a polyamide-imide resin, and a polyketone resin. The resin of the preferred embodiment is bisphenol F epoxy resin (Shell 862).

Initially, titanium dioxide alone was used as the only filler in the print receptive coating 14 to achieve whiteness. Titanium dioxide is commonly known as the most efficient pigment for white color and opacity. Using titanium dioxide as the only filler in the resin system, an opacity of over 90% was obtained at a coating thickness of 0.0003 inches. This coating, however, could not pass a "nickel rub" test, because $TiO_2$ is a hard irregular filler particle with abrasive characteristics. In an application involving a bar-code label, the label comes into contact with bar-code scanner tips, which are frequently nickel-chrome plated. Nickel-chrome oxide is black in color. When a scanner tip comes into contact with an abrasive surface, the black oxide layer leaves a black mark on the surface. These black marks can interfere with a scanner's ability to read the code. Such a mark-off is considered unacceptable in a bar-code label application.

An alternate white pigment considered was barium sulfate ($BaSO_4$). Barium sulfate has a rounded particle structure making it a non-abrasive material. Its crystalline structure, though, makes it more translucent than $TiO_2$ creating problems with opacity and color.

Superior results are obtained using boron nitride as a filler in the resin system. Such results are attributed to the morphology of boron nitride. The boron nitride particle shape is a platelet. The platelet shape of the boron nitride allows for the filler to cover a large surface area in relation to its size when it orients itself within the resin system; hence, its unique slip and opacity characteristics. In addition, boron nitride is much less abrasive than $TiO_2$ used alone. Further, it is superior to barium sulfate in terms of both opacity and color properties.

Because boron nitride is very expensive, and boron nitride alone in the resin system does not result in an opacity as high as that achieved with pure $TiO_2$, ratios of $TiO_2$/BN were tested to determine the optimum ratio providing both whiteness and opacity, yet non-abrasive. In this regard, several grades of $TiO_2$ and BN were also evaluated. The optimum ratio was determined to be at about 90 wt. % BN to about 10 wt. % $TiO_2$. Some marking was observed at 13 wt. % $TiO_2$; however, higher ratios of $TiO_2$ can be used at lower filler loadings.

The filler to resin ratio was also optimized and found to be 45 percent by volume of filler to resin. At this ratio, the necessary whiteness level was achieved.

The print receptive coating 14 also contains a reactive diluent to increase the ability of the epoxy resin to wet out the filler and allow the particles to lay flat. To improve mar resistance, the viscosity of the resin was reduced by providing the reactive diluent. The filler settles to the bottom leaving the top portion of the coating resin rich. Suitable diluents for use in the practice of the present invention include butyl glycidyl ether, Araldite RD-1,1,4 butanediol diglycidyl ether, Araldite RD-2, cresyl glycidyl ether, Araldite 023, phenyl glycidyl ether, glycidyl aniline. In the preferred embodiment, an alkylglycidyl ether (Shell Heloxy 8) is used.

The print receptive coating 14 is also comprised of a curing agent. Specific materials which can be used as the curing agent include aliphatic amines, cyclic amines, and cycloamines. Particular amines suitable for use in the practice of the present invention include monoethanol amine, diethanol amine, aminoethyl ethanolamide, aminoethyl piperazinone, ethylene diamine, diethyl aminopropylamine, and pentaethylene hexamine. A preferred curing agent is an aliphatic amine adduct curing agent (triethylene tetramine from Shell 3295).

An antioxidant is also used in the print receptive coating 14 to improve the oxidative stability of the coating. The original prototypes did not have an antioxidant in the print receptive coating 14. In the high temperature heat exposure of these prototypes at 400° F., 500° F., and 600° F., the printable surface oxidized and turned brown. As a result, an antioxidant was added to the coating. Representative of the antioxidants that can be used in the present invention are Naugard 10 (Uniroyal), BNX 1076 (May 20), and BNX 1000 (May 20). The preferred antioxidant is Thiodiethylene bis (3,5-di-tert-butyl-4-hydroxyhydrocinnamate).

The opacifying coating 12 shown in FIG. 1 is applied as an interlayer between the substrate 10 and the print receptive coating layer 14. The opacifying coating 12 is made up of an epoxy resin and a filler containing aluminum flake and titanium dioxide.

In the preferred embodiment, the resin of the opacifying coating 12 is bisphenol A epoxy resin (Shell 828). Representative alternative resins for use in the opacifying coating 12 include a polyurethane resin, an alkyd amine resin, a phenolic resin, a polyethersulfone resin, and a polyamide-imide resin. The resin system selected for the opacifying coating 12 should preferably be identical to that selected for the print receptive coating 14. The systems do not have to be identical, though, as long as good adhesion is obtained between the layers.

Aluminum flakes are also used as a filler in the opacifying coating 12, since aluminum has no light transmission. In place of aluminum flakes, nickel, tin, silver or other metal flakes could be used.

Titanium dioxide is also used as a filler in the resin system of the opacifying layer 12 to decrease its contrast to the top printable coating. In the bar-code label construction represented by FIG. 1, the thickness of the opacifying layer 12 is 0.2±0.05 mil. The opacifying layer 12 is preferably as thin as possible to reduce the overall cost of the coating and make the bar code label suitable from a marketing standpoint.

As an example of the substrate 10, the following films can be used: polyimide film; polyethersulfone film; polyetherketone film; polyethylene naphthalene film; polyester film; and polyetherimide film. In the preferred embodiment, the substrate 10 is a polyimide film, having a thickness of about 2 mil.

The opposite side of substrate 10 is coated or thermoset onto acrylic PSA 16 by reverse roll coating. Preferably, the acrylic PSA is #538m from H+N chemical and has a dry film thickness of 0.6 mil. The acrylic PSA 16 is laminated to a silicone coated release liner 18. The silicone coated release liner 18 is coated onto 55# super densified paper 20 in a separate production step by gravure on reverse roll coating.

The present invention will now be described in greater detail in the following examples.

EXAMPLE I

To hydrolyze silane, 10 lbs. isopropanol (IPA from Fish Chemical), 0.34 lbs. gamma aminopropyltrimethoxysilane (OSI A-1100), and 0.34 lbs. gamma glycidoxypropyltrimethoxysilane (OSI A-187) were added to a clean pail. The resultant silane solution was stirred for 20 minutes.

The fillers for the resin system were prepared by weighing out 7.46 lbs. aluminum flake (Reynolds 30XD) and 26.92 lbs. titanium oxide (Tioxide RXLI) in a separate pail. The silane solution was then added to the fillers. Enough xylene (6.50 lbs.) (Fish Chemical) was then added to the pail to wet the fillers. The contents of the pail were stirred so that all of the powder was wetted out. The resultant filler slurry was allowed to stand for 30 minutes.

After 30 minutes, 13.96 lbs. bisphenol A epoxy resin (Shell 828) and 0.56 lbs. titanium IV 2-Propanolato (Kenrich KRTTS) were slowly added to the slurry while mixing. A three roll mill was then used to disburse the filler in the resin system and provide optimum filler to resin ratio.

The resultant fill/resin slurry was placed in a 55 gallon drum and mixed with 30.43 lbs. MEK (Fish Chemical) for approximately 20 minutes. 3.49 lbs. triethylenetetramine (Shell 3295) (used as the curing agent) were added to the filler/resin slurry to prepare the mixture for coating. The coating was mixed for 15 minutes at a high shear rate.

The resultant formulation for the opacifying coating is indicated below in TABLE I.

TABLE I

| SUPPLIER | DESCRIPTION | ITEM | WEIGHT (%) |
| --- | --- | --- | --- |
| Shell | bisphenol A epoxy resin | Epon 828 | 13.96 |
| Reynolds | aluminum flake | 30XD | 7.46 |
| Tioxide | titanium dioxide | RXLI | 26.92 |
| Shell | triethylenetetramine (cure agent) | Epicure 3295 | 3.49 |
| OSI | gamma aminopropyltrimethoxysilane | A1100 | 0.34 |
| OSI | gamma glycidoxypropyltrimethoxy-silane | A187 | 0.34 |
| Kenrich Petrochem | titanium IV 2-propanolato | KR-TTS | 0.56 |
| Fish Chemical | solvent | MEK | 30.43 |
| Fish Chemical | solvent | IPA | 10.00 |
| Fish Chemical | solvent | Xylene | 6.50 |

TOTAL SOLIDS: 49.64%
100 lbs. total weight

EXAMPLE II

To hydrolyze silane, 12.0 lbs. isopropanol (IPA from Fish Chemical) and 0.10 lbs. (45.63g) gamma aminopropyltriethoxysilane (OSI A-1100) were added to a clean pail. The resultant silane solution was stirred for 20 minutes.

The fillers for the resin system were prepared by weighing out 11.38 lbs. boron nitride (Advanced Ceramics AC 6003) and 2.25 lbs. titanium dioxide (Tioxide RXLI) in a separate pail. The silane solution was added to the fillers. 48.0 lbs. MEK (Fish Chemical) were then added to the pail to wet the fillers. The contents of the pail were stirred so that all of the powder was completely wetted. The resultant filler slurry was allowed to stand for 30 minutes.

In a separate pail, 4.41 lbs. of the bisphenol F epoxy resin (Shell 862) and 0.50 lbs. aliphatic epoxide (Shell Heloxy 8) were added together. 20 lbs. MEK and 0.53 lbs. hydroxyhydrocinnamate (Irganox 1035) were added to the pail. The solution was mixed until the resin was dissolved. The solution was allowed to stand for 30 minutes.

The epoxy solution was then added to the filler slurry and ball milled for 24 hrs. 1.40 lbs. triethylenetetramine (Shell Epicure 3295) were then added to the 55 gallon drum to prepare the mixture for coating. The coating was mixed for 15 minutes at a high shear rate.

The resultant print receptive coating had the formulation indicated below in TABLE II.

TABLE II

| SUPPLIER | DESCRIPTION | ITEM | WEIGHT (%) |
| --- | --- | --- | --- |
| Shell | bisphenol F epoxy resin | Epon 862 | 4.41 |
| Shell | aliphatic epoxide | Heloxy 8 | 0.50 |
| Shell | triethylenetetramine (cure agent) | Epicure 3295 | 1.40 |
| Advanced Ceramics | boron nitride | AC 6003 | 11.38 |
| Tioxide | titanium dioxide | RXLI | 2.25 |
| OSI | gamma aminopropyltriethoxysilane | A1100 | 0.10 |
| Ciba-Geigy | hydroxyhydrocinnamate | Irganox 1035 | 0.53 |
| Fish Chemical | solvent | MEK | 68.00 |
| Fish Chemical | solvent | IPA | 12.00 |

TOTAL SOLIDS: 19.93%
100 lbs. total weight

EXAMPLE III

Example II was repeated in an identical manner with the exceptions that a polyurethane resin system was substituted for the bisphenol F epoxy resin and a three roll mill was used to disburse the fillers in the resin system.

The resultant print receptive coating had the formulation indicated below in TABLE III.

TABLE III

| SUPPLIER | DESCRIPTION | ITEM | WEIGHT (%) |
| --- | --- | --- | --- |
| Miles | polyesterpolyol | 1300-75 | 9.06 |
| Miles | aliphatic isocyanate | HL | 5.62 |
| Advanced Ceramics | boron nitride | AC6003 | 16.96 |
| Tioxide | titanium dioxide | RXLI | 3.35 |
| Fish Chemical | solvent | MEK | 58.50 |
| Fish Chemical | solvent | Ethyl Acetate | 6.50 |

TOTAL SOLIDS: 30.5%

EXAMPLE IV

Example II was repeated in an identical manner with the exceptions that an alkyd amine resin system was substituted for the bisphenol F epoxy resin and a three roll mill was used to disburse the fillers in the resin system.

The resultant print receptive coating had the formulation indicated below in TABLE IV.

TABLE IV

| SUPPLIER | DESCRIPTION | ITEM | WEIGHT (%) |
| --- | --- | --- | --- |
| Morton | alkyd amine | 21P2B | 11.35 |
| Morton | toluenesulfonic acid | Catalyst M | 0.45 |
| Advanced Ceramics | boron nitride | AC6003 | 18.81 |

TABLE IV-continued

| SUPPLIER | DESCRIPTION | ITEM | WEIGHT (%) |
|---|---|---|---|
| Tioxide | titanium dioxide | RXLI | 3.72 |
| OSI | gamma aminopropyltriethoxysilane | A1100 | 0.67 |
| Fish Chemical | solvent | MEK | 65.00 |

TOTAL SOLIDS: 29.8%

EXAMPLE V

Example II was repeated in an identical manner with the exceptions that a phenolic resin system was substituted for the bisphenol F epoxy resin and a three roll mill was used to disburse the fillers in the resin system.

The resultant print receptive coating had the formulation indicated below in TABLE V.

TABLE V

| SUPPLIER | DESCRIPTION | ITEM | WEIGHT (%) |
|---|---|---|---|
| Oxy Chemical | formaldhyde polymer (methylon) | 75–108 | 17.74 |
| Advanced Ceramics | boron nitride | AC6003 | 17.74 |
| Tioxide | titanium dioxide | RXLI | 3.50 |
| Fish Chemical | solvent | MEK | 66.84 |

TOTAL SOLIDS: 33.2%

EXAMPLE VI

Example II was repeated in an identical manner with the exceptions that a polyethersulfone resin system was substituted for the bisphenol F epoxy resin and a three roll mill was used to disburse the fillers in the resin system.

The resultant print receptive coating had the formulation indicated below in TABLE VI.

TABLE VI

| SUPPLIER | DESCRIPTION | ITEM | WEIGHT (%) |
|---|---|---|---|
| Amoco | polyethersulfone | Radel A | 11.92 |
| Advanced Ceramics | boron nitride | AC6003 | 17.74 |
| Tioxide | titanium dioxide | RXLI | 3.50 |
| Fish Chemical | solvent | MEK | 66.84 |

TOTAL SOLIDS: 33.2%

EXAMPLE VII

Example II was repeated in an identical manner with the exceptions that a polyamide-imide resin system was substituted for the bisphenol F epoxy resin and a three roll mill was used to disburse the fillers in the resin system.

The resultant print receptive coating had the formulation indicated below in TABLE VII.

TABLE VII

| SUPPLIER | DESCRIPTION | ITEM | WEIGHT (%) |
|---|---|---|---|
| Amoco | polyamide-imide | A1–10 | 10.26 |
| Advanced Ceramics | boron nitride | AC6003 | 17.77 |
| Tioxide | titanium dioxide | RXLI | 1.97 |
| GAF | n-methyl pyrrolidone | NMP | 70.00 |

TOTAL SOLIDS 30.0%

EXAMPLE VIII

Example II was repeated in an identical manner with the exceptions that a polyketone resin system was substituted for the bisphenol F epoxy resin and a three roll mill was used to disburse the fillers in the resin system.

The resultant print receptive coating had the formulation indicated below in Table VIII.

TABLE VIII

| SUPPLIER | DESCRIPTION | ITEM | WEIGHT (%) |
|---|---|---|---|
| Amoco | polyketone | Kadel | 10.26 |
| Advanced Ceramics | boron nitride | AC6003 | 17.77 |
| Tioxide | titanium dioxide | RXLI | 1.97 |
| Texaco | methyl ethyl ketone | MEK | 70.00 |

TOTAL SOLIDS: 30.0%

EXAMPLE IX

The coating formed in Example I was applied to a 2 mil polyimide film and was coated at a thickness of 0.20 mil (dry) using gravure coating. The resultant film and coating were drawn through an oven heated to 380° F. at 10 yards/minute. The coating itself saw a minimum temperature of 260° F. Once the coated film exited the oven, it was contacted with a heating hot can at 360° F. and wound into a roll.

A 0.60 mil dried layer of the coating formed in Example II was applied to the rolled film using reverse roll coating. The film was drawn through an oven heated to 380° F. at 10 yards/minute. The second coating saw a minimum temperature of 260° F. Once the film coated with the first and second coatings exited the oven, it was contacted with a heating hot can at 360° F. and wound into a roll. The resultant film and coatings were placed in an oven at 50° C. overnight to fully cure the coatings.

The resultant film and coatings were then further processed in a similar roll-to-roll process to apply a 0.0006 inch thick layer of a high temperature cross-linking acrylic pressure sensitive adhesive (PSA). As the web exited the oven after the application of the PSA, it was then laminated to a release liner constructed by coating a silicone release coating onto a 55# superdensified paper in a separate production step.

This construction was then slit to label printing equipment widths and subsequently kiss-cut through the label construction, but not through the silicone coated paper.

The resultant film product was subjected to various quantitative and qualitative testing, including the following:

(1) THICKNESS. Using a micrometer the total thickness of the coating was measured. The thickness of the substrate was subtracted. It was determined that the resultant thickness (x) of the coating was greater than 0.3 mil and less than 2.0 mil.

(2) PIGMENT CHALKING. A finger was rubbed over the coating to determine whether any color could be removed. A visual inspection showed no color, indicating no removal of the pigment from the coating or no removal of the coating from the film.

(3) X-HATCH ADHESION. Using a knife, 7 to 8 parallel straight lines were cut through the top of the coating, but not through the film. Seven to eight lines perpendicular to the parallel lines were then cut through the coating. A piece of 600 tape was placed diagonally across the cuts. The tape was laminated to the cuts area. After a 30 second tape dwell time, the tape was quickly pulled off the coating. Removal of the coating was determined to be less than 5% of the total coated surface area.

(4) COLOR. The color was visually inspected and determined to be white.

(5) SOLVENT RESISTANCE. Using an eye dropper, both MEK and toluene were spotted on top of the coating. The solvent was allowed to evaporate and then visually inspected. No solvent penetration was evident.

As another measurement of the solvent resistance, a piece of the film product was emerged in trichloroethylene for 24 hours and then visually inspected. No solvent penetration was evident.

(6) OPACITY. Using a haze meter, the opacity of the coating material was measured and determined to be greater than 99%.

(7) NICKEL RUB. Using a nickel, the film product was scratched across the surface of the coating. No visual dark mark was found to be present.

(8) ACID TEST. A 2×2 piece of the film product was placed into a solution of 50% sulfuric acid for eight hours and then visually inspected. No discoloration or attack on the coated film product was observed.

(9) PRINTABILITY. A section of an 8"×10" sheet of the film product was placed into a laser copier and ribbon transfer printer. The image was found to print with good definition and the ink was found to adhere to the film product.

(10) SOLDER IMMERSION. A piece of the film product (adhesive, film, topcoat) was placed on an epoxy printed circuit board, into a molten solder at approximately 210° C. for a period of 30 seconds, and then visually inspected and put in another 30 seconds. No shrinkage, color change, or deformity was observed.

(11) TEMPERATURE TEST. A piece of the film product was placed in an oven for five minutes at 300° F., 400° F. and 500° F. An acceptable level of discoloration was observed at each temperature.

The invention has been described with reference to preferred and alternate embodiments. Obviously, modifications and alterations will occur to others upon the reading and understanding of this specification. It is intended to include all such modifications and alterations insofar as they come within the scope of the appended claims or the equivalents thereof.

What is claimed is:

1. A film for use in thermally and chemically demanding applications, said film comprising a substrate and a first coating applied on one surface of said substrate and a second coating applied as an interlayer between said first coating and said substrate, said first coating having a filler comprising titanium dioxide and boron nitride wherein said titanium dioxide and said boron nitride are present in a ratio of about 90 parts by weight boron nitride to about 10 parts by weight titanium dioxide.

2. The film of claim 1 wherein said second coating comprises a resin and a filler, said filler comprising titanium dioxide.

3. The film of claim 1 wherein said first coating further comprises a resin selected from the group consisting of an epoxy, a polyurethane, an alkyd amine, a phenolic, a polyethersulfone, a polyamide-imide, and a polyketone.

4. The film of claim 1 wherein said substrate is selected from the group consisting of a polyimide, a polyethersulfone, a polyetherketone, a polyethylene naphthalene, a polyester and a polyetherimide.

5. The film of claim 2 wherein said second coating further comprises aluminum, said resin of said second coating being a bisphenol A epoxy resin.

6. A label readable by a bar-code reader, said label comprising a substrate having on at least one surface thereof a first coating comprising a resin and a filler, said filler comprising boron nitride and titanium dioxide, said boron nitride and said titanium dioxide being present in a ratio of about 90 parts by weight boron nitride to about 10 parts by weight titanium dioxide.

7. The label of claim 6 wherein said substrate is selected from the group consisting of a polyimide, a polyethersulfone, a polyetherketone, a polyethylene naphthalene, a polyester, and a polyetherimide.

8. The label of claim 6 further comprising a second coating applied between said first coating and said substrate, said second coating comprising a second resin and a second filler, said second filler comprising titanium dioxide.

9. The label of claim 6 wherein said resin of said first coating is selected from the group consisting of an epoxy, a polyurethane, an alkyd amine, a phenolic, a polyethersulfone, a polyamide-imide, and a polyketone.

10. The label of claim 7 wherein said first coating has a thickness of about 0.6 mil and said second coating has a thickness of about 0.2 mil.

11. The label of claim 6 wherein said substrate has a thickness of about 2 mils.

* * * * *